(12) United States Patent
Weng et al.

(10) Patent No.: US 10,411,479 B2
(45) Date of Patent: Sep. 10, 2019

(54) DETECTION CIRCUIT AND DETECTION METHOD FOR DETECTING INSULATION RESISTANCE OF PHOTOVOLTAIC INVERTER, AND PHOTOVOLTAIC INVERTER

(71) Applicant: Delta Electronics (Shanghai) CO., LTD, Shanghai (CN)

(72) Inventors: Bingwen Weng, Shanghai (CN); Xuancai Zhu, Shanghai (CN); Kerou Wang, Shanghai (CN); Jinfa Zhang, Shanghai (CN)

(73) Assignee: Delta Electronics (Shanghai) CO., LTD, Shanghai (CN)

( * ) Notice: Subject to any disclaimer, the term of this patent is extended or adjusted under 35 U.S.C. 154(b) by 254 days.

(21) Appl. No.: 15/407,469

(22) Filed: Jan. 17, 2017

(65) Prior Publication Data

US 2017/0302082 A1 Oct. 19, 2017

(30) Foreign Application Priority Data

Apr. 19, 2016 (CN) .......................... 2016 1 0243810

(51) Int. Cl.
*H02J 3/38* (2006.01)
*H02S 50/10* (2014.01)
(Continued)

(52) U.S. Cl.
CPC .............. *H02J 3/385* (2013.01); *G01R 27/18* (2013.01); *G01R 31/40* (2013.01); *H02M 3/155* (2013.01);
(Continued)

(58) Field of Classification Search
CPC .................................. H02J 3/385; H02M 7/537
See application file for complete search history.

(56) References Cited

U.S. PATENT DOCUMENTS

| 7,576,547 | B2 * | 8/2009 | Muller | .................. | G01R 27/18 |
| | | | | | 324/522 |
| 2009/0244938 | A1 * | 10/2009 | Gebert | ............... | H01H 85/0241 |
| | | | | | 363/55 |

(Continued)

FOREIGN PATENT DOCUMENTS

| CN | 102346224 A | 2/2012 |
| CN | 102520254 A | 6/2012 |

(Continued)

OTHER PUBLICATIONS

The CN1OA issued Apr. 10, 2019 by the CNIPA.

*Primary Examiner* — Jeffrey M Shin
(74) *Attorney, Agent, or Firm* — Yunling Ren (57) ABSTRACT

A detection circuit includes: a first switch, a second switch, a first detection resistor and a second detection resistor, wherein the first switch and the first detection resistor are coupled in series to form a first branch, a first end of the first branch is electrically connected with a positive bus of the photovoltaic inverter and a second end of the first branch is electrically connected with a ground; and the second switch and the second detection resistor are coupled in series to form a second branch, a first end of the second branch is electrically connected with a negative bus of the photovoltaic inverter and a second end of the second branch is electrically connected with the ground.

17 Claims, 7 Drawing Sheets

(51) Int. Cl.
  *G01R 27/18* (2006.01)
  *G01R 31/40* (2014.01)
  *H02M 7/537* (2006.01)
  *H02M 3/155* (2006.01)
  *H02M 7/5387* (2007.01)
  *H02M 1/00* (2006.01)

(52) U.S. Cl.
  CPC ......... *H02M 7/537* (2013.01); *H02M 7/5387* (2013.01); *H02S 50/10* (2014.12); *H02M 2001/007* (2013.01); *Y02E 10/58* (2013.01)

(56) References Cited

U.S. PATENT DOCUMENTS

| | | | |
|---|---|---|---|
| 2012/0163048 A1* | 6/2012 | Victor | ...................... H02H 3/16 363/55 |
| 2015/0185272 A1 | 7/2015 | Oberzaucher et al. | |

FOREIGN PATENT DOCUMENTS

| | | |
|---|---|---|
| CN | 102621394 A | 8/2012 |
| CN | 203249968 U | 10/2013 |
| CN | 104535839 A | 4/2015 |
| CN | 105356848 A | 2/2016 |
| JP | 2013-60776 A | 4/2013 |

\* cited by examiner

DETECTION CIRCUIT AND DETECTION METHOD FOR DETECTING INSULATION RESISTANCE OF PHOTOVOLTAIC INVERTER, AND PHOTOVOLTAIC INVERTER

CROSS REFERENCE

This application is based upon and claims priority to Chinese Patent Application No. 201610243810.9, filed on Apr. 19, 2016, the entire contents thereof are incorporated herein by reference.

TECHNICAL FIELD

The present disclosure relates to the field of photovoltaic inverter technology, and more particularly, to a detection circuit and a detection method for detecting insulation resistance of a photovoltaic inverter, and a photovoltaic inverter.

BACKGROUND

Currently, insulation impedance of non-isolated photovoltaic grid-connected inverters is prescribed in photovoltaic grid-connected standards in many countries, such as VDE-0126, UL1741, etc. It requires that insulation impedance of the photovoltaic array which connected to the grid connected inverter is not smaller than a specified value before starting grid-connected operation. Therefore, in corresponding non-isolated grid-connected inverter products, insulation impedance of the photovoltaic inverter needs to be detected before conducting the grid-connected generation operation.

Currently, in the market, demand for multi-inputs of inverter products is growing. However, existing detection methods for detecting insulation resistance cannot be well suited for the inverters with multi-inputs. When it is required to measure insulation impedance of photovoltaic (PV) inverters with multi-inputs, a plurality of resistors and switches need to be added. With increase of the number of inputs, the detection circuit and calculation method are becoming increasingly complex. The circuits and methods do not have universality. Alternatively, photovoltaic input is required to be changed by illumination change or artificially, thus obtaining a plurality of equations to solve for the insulation impedance. This detection method is difficult to be controlled automatically, and has poor practicality.

SUMMARY

The present disclosure provides a detection circuit and a detection method for detecting insulation resistance, and a photovoltaic inverter, which may be applied to a photovoltaic inverter with multi-inputs. The method can also detect the insulation resistance failure in any point of photovoltaic array.

The other features and advantages of the present disclosure will become apparent from the following description, or may be partly learned by the practice of the present disclosure.

According to an aspect of the present disclosure, there is provided an detection circuit for detecting insulation resistance of a photovoltaic inverter, including: a first switch, a second switch, a first detection resistor and a second detection resistor; wherein the first switch and the first detection resistor are coupled in series to form a first branch, and a first end of the first branch is electrically connected with a positive bus of the photovoltaic inverter and a second end of the first branch is electrically connected with a ground; wherein the second switch and the second detection resistor are coupled in series to form a second branch, and a first end of the second branch is electrically connected with a negative bus of the photovoltaic inverter and a second end of the second branch is electrically connected with the ground.

According to another aspect of the present disclosure, there is provided a detection method for detecting insulation resistance of a photovoltaic inverter, applied to any one of the above detection circuits for detecting insulation resistance of a photovoltaic inverter, including: sampling and obtaining a positive bus voltage and a negative bus voltage of the photovoltaic inverter; turning on the first switch and turning off the second switch, and measuring a first ground voltage of the ground to obtain a first equation; turning off the first switch and turning on the second switch, and measuring a second ground voltage of the ground to obtain a second equation; and calculating a total insulation impedance of at least one photovoltaic module string coupled to the photovoltaic inverter with respect to the ground according to the first equation and the second equation, wherein the total insulation impedance is defined as equivalent resistance of paralleling insulation impedances of the at least photovoltaic module string with respect to the ground.

It is to be understood that both the foregoing general description and the following detailed description are exemplary only and are not restrictive of the invention.

BRIEF DESCRIPTION OF THE DRAWINGS

The exemplary embodiments of the disclosure will be described in detail with reference to the accompanying drawings, through which the above and other objects, features and advantages of the disclosure will become more apparent.

FIG. 2C is an equivalent circuit of the simplified circuit as shown in FIG. 2A when the first switch is turned off and the second switch is turned on.

DETAILED DESCRIPTION

The exemplary implementations will now be described more fully with reference to the accompanying drawings. However, the exemplary implementations may be implemented in various forms and should not be understood as being limited to the implementations set forth herein; on the contrary, these implementations are provided so that this disclosure will be thorough and complete, and the conception of exemplary implementations will be fully conveyed to those skilled in the art. The accompanying drawings are only schematic illustration of the present disclosure, and are not drawn to scale. In the drawings, the same reference numerals denote the same or similar structure, thus their detailed description will be omitted.

In addition, the features, structures or characteristics described herein can be combined in one or more implementations in any appropriate way. In the description herein, many specific details are provided for full understanding of the embodiments of the present disclosure. However, it will be appreciated by those skilled in the art that the technical solution of the present disclosure can be practiced without one or more of the specific details, or with other methods, components, devices or steps, etc. In other cases, known structures, methods, devices, implementations or operations will not be illustrated or described in detail, to avoid obscuration of the aspects of the present disclosure.

Figure 1:
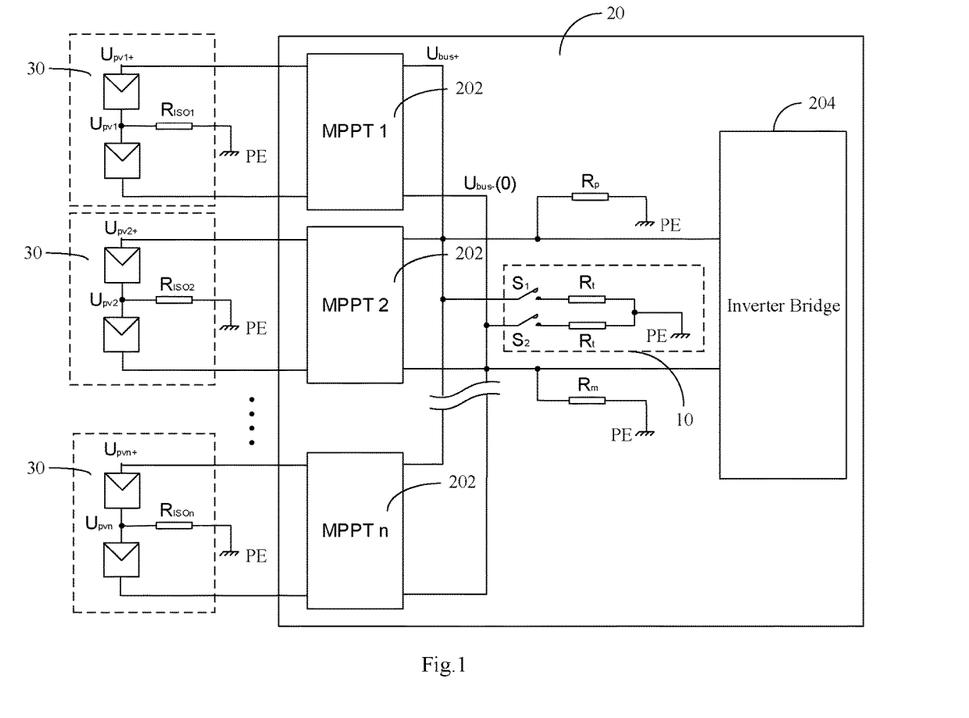
FIG. 1 is a schematic diagram of a detection circuit for detecting insulation resistance of a photovoltaic inverter according to an exemplary implementation.

FIG. 1 is a schematic diagram of a detection circuit for detecting insulation resistance of a photovoltaic inverter according to an exemplary implementation. As shown in FIG. 1, the detection circuit 10 for detecting insulation resistance includes: a first switch $S_1$, a second switch $S_2$, a first detection resistor $R_{t1}$ and a second detection resistor $R_{t2}$.

In the present embodiment, the first switch $S_1$ and the first detection resistor $R_{t1}$ are coupled in series to form a first branch, and a first end of the first branch is electrically connected with a positive bus (wherein a voltage of the positive bus is $U_{bus+}$) of the photovoltaic inverter 20 and the other end of the first branch is electrically connected with a ground PE. The second switch $S_2$ and the second detection resistor $R_{t2}$ are coupled in series to form a second branch, and a first end of the second branch is electrically connected with a negative bus (wherein a voltage of the negative bus is $U_{bus-}$) of the photovoltaic inverter 20 and the other end of the second branch is electrically connected with the ground PE. It should be noted that in the circuit, the voltage $U_{bus-}$ of the negative bus is reference potential (i.e., zero potential). According to an exemplary embodiment, the resistance value of the first detection resistor $R_{t1}$ is equal to that of the second detection resistor $R_{t2}$. According to another exemplary embodiment, the resistance value of the first detection resistor $R_{t1}$ is different from that of the second detection resistor $R_{t2}$.

The first switch $S_1$ and the second switch $S_2$ are controllable switches, for example, they may be two single-pole relays, one single-pole double-throw relay, or two controllable semiconductor switches.

In addition, $R_p$ and $R_m$ as shown in FIG. 1 are equivalent resistors of the positive bus and the negative bus with respect to the ground PE respectively.

The detection circuit 10 may be connected to a maximum power point tracking (MPPT) circuit 202 of the photovoltaic inverter 20 and an inverter bridge 204 of the photovoltaic inverter 20. A circuit topology of the MPPT circuit 202 may be a Boost circuit topology, or may be other topology that an input voltage may be forwardly directed to an output end via a diode when a switching transistor is not operating. A circuit topology of the inverter bridge 204 may be a full bridge circuit or other bridge circuits.

In addition, a plurality of photovoltaic module strings 30 are respectively coupled to a plurality of MPPT circuits 202 of the photovoltaic inverter 20.

In the photovoltaic module strings 30, $U_{pv1+}$, $U_{pv2+}$, ..., $U_{pvn+}$ are voltages of respective photovoltaic module strings 30 respectively. $U_{pv1}$, $U_{pv2}$, ..., $U_{pvn}$ are voltages of points to be measured of the respective photovoltaic module strings 30 respectively, whose minimum value may be 0 V and maximum value may be the voltages $U_{pv1+}$, $U_{pv2+}$, ..., $U_{pvn+}$ of corresponding photovoltaic module strings 30. $R_{ISO1}$, $R_{ISO2}$, ..., $R_{ISOn}$ are fault insulation resistance values of respective photovoltaic module strings 30 with respect to the ground.

Figure 2A:
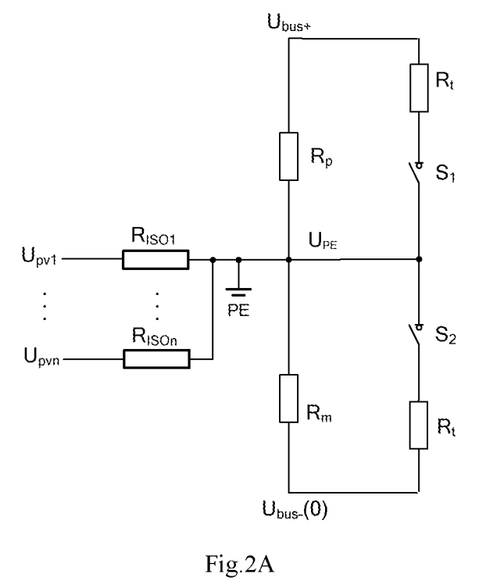
FIG. 2A is a simplified circuit of a detection circuit for detecting insulation resistance before operating an MPPT circuit and an inverter bridge of the photovoltaic inverter as shown in FIG. 1.
Figure 2B:
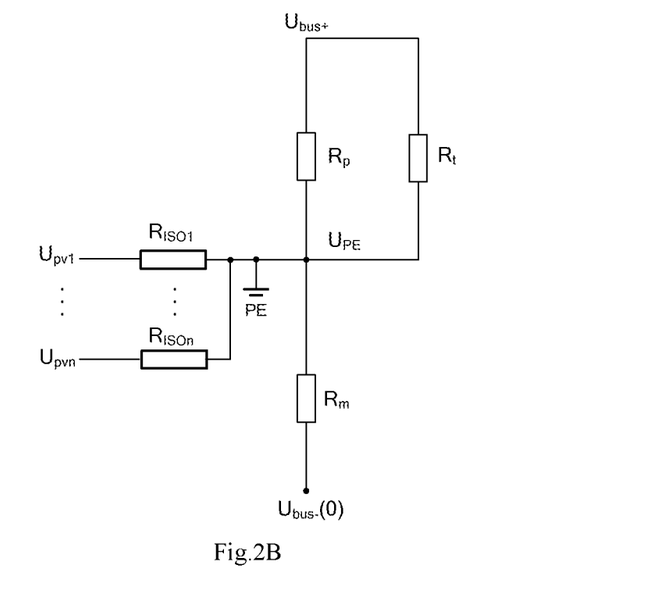
FIG. 2B is an equivalent circuit of the simplified circuit as shown in FIG. 2A when the first switch is turned on and the second switch is turned off.
Figure 2C:
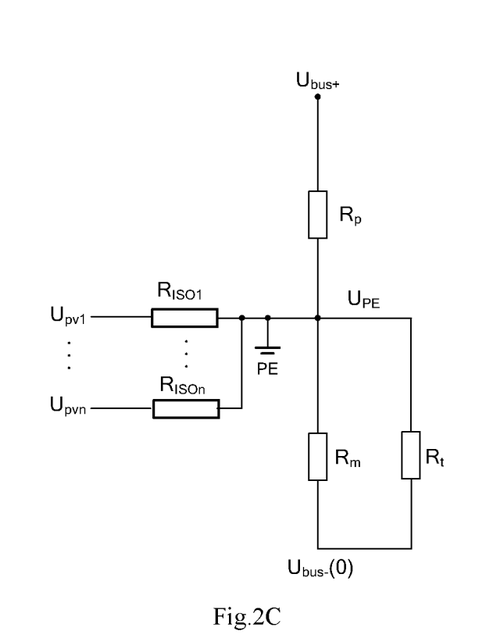

FIG. 2A is a simplified circuit of a detection circuit for detecting insulation resistance before operating an MPPT circuit and an inverter bridge of the photovoltaic inverter as shown in FIG. 1. FIG. 2B is an equivalent circuit of the simplified circuit as shown in FIG. 2A when the first switch is turned on and the second switch is turned off, and in this circuit state, a voltage value of the ground PE is measured to be $U_{PE}$. FIG. 2C is an equivalent circuit of the simplified circuit as shown in FIG. 2A when the first switch is turned off and the second switch is turned on, and in this circuit state, a voltage value of the ground PE is measured to be $U'_{PE}$.

Setting $R_{t1}=R_{t2}=R_t$, a value of $R_t$ and a value of a measurement target (i.e., a threshold value of insulation impedance with respect to specification requirements of the photovoltaic inverter) are in the same order of magnitude.

In a measurement process, since voltages of the external photovoltaic arrays do not change, a bus voltage value $U_{bus}$ of the photovoltaic inverter is kept unchanged, wherein $U_{bus}=U_{bus+}-U_{bus-}$.

Based on two equivalent circuit states as shown in FIGS. 2B and 2C, a following equation set may be provided:

$$\begin{cases} \dfrac{U_{PV1}-U_{PE}}{R_{ISO1}}+\dfrac{U_{PV2}-U_{PE}}{R_{ISO2}}+\ldots+\dfrac{U_{PVn}-U_{PE}}{R_{ISOn}}+\dfrac{U_{bus}-U_{PE}}{R_p//R_t}=\dfrac{U_{PE}}{R_m} \\ \dfrac{U_{PV1}-U'_{PE}}{R_{ISO1}}+\dfrac{U_{PV2}-U'_{PE}}{R_{ISO2}}+\ldots+\dfrac{U_{PVn}-U'_{PE}}{R_{ISOn}}+\dfrac{U_{bus}-U'_{PE}}{R_p}=\dfrac{U'_{PE}}{R_m//R_t} \end{cases} \quad (1)$$

A following equation may be obtained through algebraic transformation:

$$\left(\dfrac{1}{R_{ISO1}}+\dfrac{1}{R_{ISO2}}+\ldots+\dfrac{1}{R_{ISOn}}\right)(U'_{PE}-U_{PE})= \quad (2)$$

$$\dfrac{(R_pR_m+R_mR_t+R_pR_t)(U_{PE}-U'_{PE})-R_mR_pU_{bus}}{R_pR_mR_t}$$

An insulation impedance $R_{ISO}$ of all photovoltaic module strings 30 may be defined as a value of insulation resistance values $R_{ISO1}$, $R_{ISO2}$, ..., $R_{ISOn}$ in parallel of respective photovoltaic module strings 30, and then a following equation may be obtained from the above equation (2):

$$R_{ISO} = \frac{R_p R_m R_t (U'_{PE} U_{PE})}{(R_p R_m + R_m R_t + R_p R_t)(U_{PE} - U'_{PE}) - R_m R_p U_{bus}} \quad (3)$$

During the measurement, since voltages of the external photovoltaic arrays (i.e., respective photovoltaic module strings) do not change, it is possible to sample the bus voltage value $U_{bus}$ only once. During the detection, the PE voltage may be sampled respectively under the above two states as shown in FIGS. 2B and 2C, to obtain values $U_{PE}$ and $U'_{PE}$. Based on the adopted topology structure of the photovoltaic inverter, equivalent internal resistance values $R_p$ and $R_m$ of the photovoltaic inverter may be obtained. Resistance values of the detection resistor $R_t$ are both known, so based on the above equation (3), a resistance value of the total insulation impedance $R_{ISO}$ of the photovoltaic array with respect to the ground may be calculated and obtained.

Figure 3:
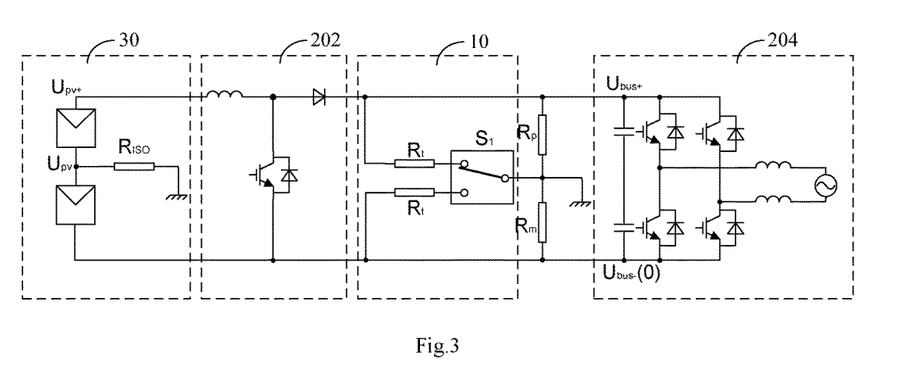
FIG. 3 is a circuit diagram that the detection circuit for detecting insulation resistance as shown in FIG. 1 is applied to a single input photovoltaic inverter according to an exemplary implementation.
Figure 4:
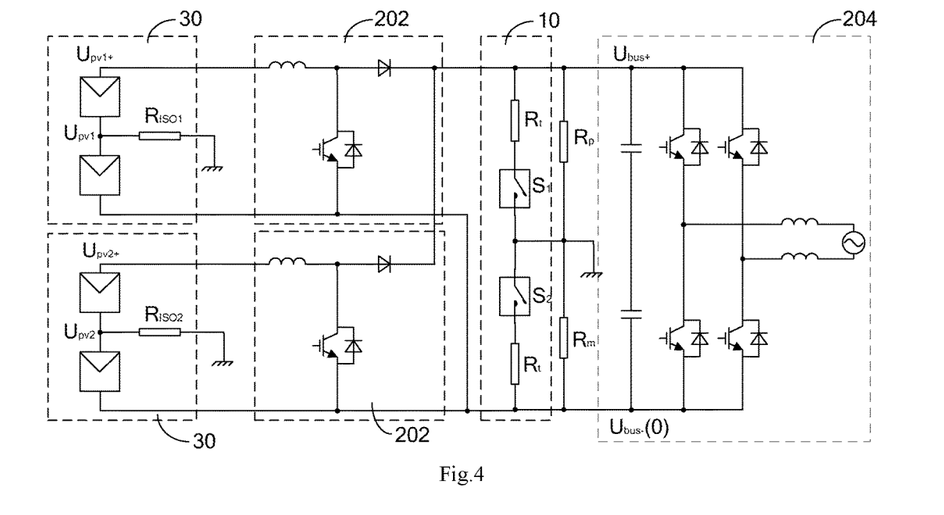
FIG. 4 is a circuit diagram that the detection circuit for detecting insulation resistance as shown in FIG. 1 is applied to a double input photovoltaic inverter according to an exemplary implementation.

FIG. 3 is a circuit diagram that the detection circuit for detecting insulation resistance as shown in FIG. 1 is applied to a single input photovoltaic inverter according to an exemplary implementation. FIG. 4 is a circuit diagram that the detection circuit for detecting insulation resistance as shown in FIG. 1 is applied to a double input photovoltaic inverter according to an exemplary implementation. In the present embodiment, the MPPT circuits 202 all take a Boost circuit as an example, and the inverter bridge circuits 204 all take a full bridge as an example. However, the present disclosure is not limited to this. It can be known from FIGS. 3 and 4 that, the detection circuit for detecting insulation resistance of a photovoltaic inverter according to the present disclosure may be applied to inverters with inputs of any number, and additional devices are not required.

The detection circuit for detecting insulation resistance of a photovoltaic inverter according to the present disclosure may accurately measure a total insulation impedance of a photovoltaic array with respect to the ground within a full input voltage range, may be applied to inverters with inputs of any number, and additional devices are not required for multiple module string inputs. No matter insulation faults occur at a positive electrode, a negative electrode or any connection point in the middle of the photovoltaic module strings, or how many insulation faults occur at the same time, a total insulation impedance of a photovoltaic array with respect to the ground may be simply and accurately calculated through the detection circuit, to comply with safety regulation requirement of the photovoltaic inverter. Further, a structure of the above detection circuit is simple, which is very suitable for automatic detection of a digital control photovoltaic inverter.

The following is a method embodiment of the present disclosure which may be applied to the above detection circuit for detecting insulation resistance. For the undisclosed details in the method embodiment of the present disclosure, please refer to the above embodiment of the detection circuit for detecting insulation resistance.

Figure 5:
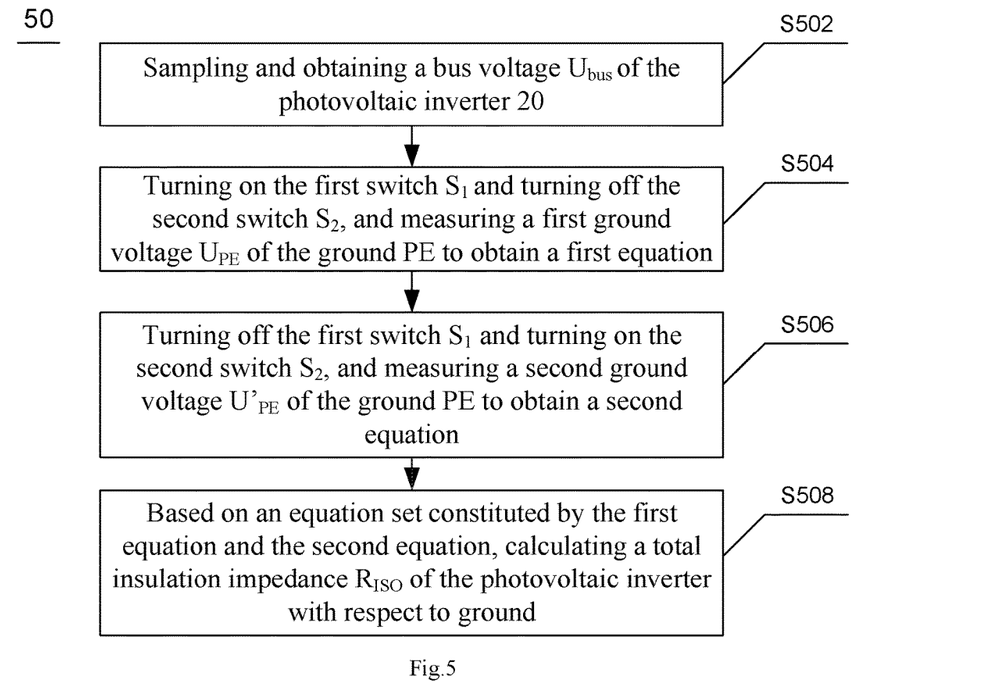
FIG. 5 is a flow chart of a detection method for detecting insulation resistance of a photovoltaic inverter according to an exemplary implementation.

FIG. 5 is a flow chart of a detection method for detecting insulation resistance of a photovoltaic inverter according to an exemplary implementation. The detection method for detecting insulation resistance of a photovoltaic inverter is applied to the detection circuit 10 for detecting insulation resistance as shown in FIG. 1. Combining to refer to FIGS. 1 and 5, a detection method 50 for detecting insulation resistance of a photovoltaic inverter includes:

in step S502, sampling and obtaining a bus voltage $U_{bus}$ of the photovoltaic inverter 20;

in step S504, turning on the first switch $S_1$ and turning off the second switch $S_2$, and measuring a first ground voltage $U_{PE}$ of the ground PE to obtain a first equation;

in step S506, turning off the first switch $S_1$ and turning on the second switch $S_2$, and measuring a second ground voltage $U'_{PE}$ of the ground PE to obtain a second equation; and in step S508, based on an equation set constituted by the first equation and the second equation, calculating a total insulation impedance $R_{ISO}$ of the photovoltaic inverter with respect to the ground.

In the present embodiment, the equation set is:

$$\begin{cases} \dfrac{U_{PV1} U_{PE}}{R_{ISO1}} + \dfrac{U_{PV2} U_{PE}}{R_{ISO2}} + \ldots + \dfrac{U_{PVn} U_{PE}}{R_{ISOn}} + \dfrac{U_{bus} U_{PE}}{R_p // R_t} = \dfrac{U_{PE}}{R_m} \\ \dfrac{U_{PV1} - U'_{PE}}{R_{ISO1}} + \dfrac{U_{PV2} - U'_{PE}}{R_{ISO2}} + \ldots + \dfrac{U_{PVn} - U'_{PE}}{R_{ISOn}} + \dfrac{U_{bus} - U'_{PE}}{R_p} = \dfrac{U'_{PE}}{R_m // R_t} \end{cases}$$

A following equation may be obtained through algebraic transformation:

$$\left(\frac{1}{R_{ISO1}} + \frac{1}{R_{ISO2}} + \ldots + \frac{1}{R_{ISOn}}\right)(U'_{PE} - U_{PE}) = \frac{(R_p R_m + R_m R_t + R_p R_t)(U_{PE} - U'_{PE}) - R_m R_p U_{bus}}{R_p R_m R_t}$$

Further, the insulation impedance $R_{ISO}$ of all photovoltaic module strings 30 may be obtained:

$$R_{ISO} = \frac{R_p R_m R_t (U'_{PE} - U_{PE})}{(R_p R_m | R_m R_t | R_p R_t)(U_{PE} U'_{PE}) R_m R_p U_{bus}}$$

wherein $R_p$ and $R_m$ are resistance values of equivalent resistors of the positive bus and the negative bus within the photovoltaic inverter 20 with respect to the ground PE, and $R_t$ is a resistance value of the first detection resistor $R_{t1}$ and the second detection resistor $R_{t2}$, which are both known values. Therefore, the insulation impedance $R_{ISO}$ may be calculated based on the equation.

The detection method for detecting insulation resistance of a photovoltaic inverter according to the present disclosure may accurately measure a total insulation impedance of a photovoltaic array with respect to the ground within a full input voltage range, may be applied to inverters with inputs of any number, and additional devices are not required for multiple module string inputs. No matter insulation faults occur at a positive electrode, a negative electrode or any connection point in the middle of the photovoltaic module strings, or how many insulation faults occur at the same time, a total insulation impedance of a photovoltaic array with respect to the ground may be simply and accurately calculated through the detection circuit, to comply with safety regulation requirement of the photovoltaic inverter. Further, the above detection method is quite simple, which is very suitable for automatic detection of a digital control photovoltaic inverter.

In addition, it should be noted that, the above drawings are only schematic illustration of processing included in the method according to exemplary implementation of the present disclosure, rather than for purposes of limitation. It is easy to understand that, processing illustrated in the above drawings does not indicate or limit time sequences of the processing.

Exemplary implementations of the present disclosure have been shown and described above. It should be understood that the present disclosure is not limited to specific structures, configuring manners or implementation methods described herein. Instead, the present disclosure intends to cover various modifications and equivalent setting included in the spirit and scope of the appended claims.

What is claimed is:

1. A detection circuit for detecting insulation resistance of a photovoltaic inverter, comprising: a first switch, a second switch, a first detection resistor and a second detection resistor;

wherein the first switch and the first detection resistor are coupled in series to form a first branch, and a first end of the first branch is electrically connected with a positive bus of the photovoltaic inverter and a second end of the first branch is electrically connected with a ground;

wherein the second switch and the second detection resistor are coupled in series to form a second branch, and a first end of the second branch is electrically connected with a negative bus of the photovoltaic inverter and a second end of the second branch is electrically connected with the ground, wherein the equation set constituted by the first equation and the second equation is:

$$\begin{cases} \frac{U_{PV1} - U_{PE}}{R_{ISO1}} + \frac{U_{PV2} - U_{PE}}{R_{ISO2}} + \ldots + \frac{U_{PVn} - U_{PE}}{R_{ISOn}} + \frac{U_{bus} - U_{PE}}{R_p // R_t} - \frac{U_{PE}}{R_m} \\ \frac{U_{PV1} - U'_{PE}}{R_{ISO1}} + \frac{U_{PV2} - U'_{PE}}{R_{ISO2}} + \ldots + \frac{U_{PVn} - U'_{PE}}{R_{ISOn}} + \frac{U_{bus} - U'_{PE}}{R_p} - \frac{U'_{PE}}{R_m // R_t} \end{cases},$$

and the total insulation impedance is:

$$R_{ISO} = \frac{R_p R_m R_t (U'_{PE} - U_{PE})}{(R_p R_m + R_m R_t + R_p R_t)(U_{PE} - U'_{PE}) - R_m R_p U_{bus}},$$

wherein $R_{ISO}$ is a resistance value of the total insulation impedance, $R_{ISO1}$, $R_{ISO2}$, ..., $R_{ISOn}$ are insulation resistance values of the respective photovoltaic module strings with respect to the ground, $R_p$ and $R_m$ are resistance values of equivalent resistors of the positive bus and the negative bus with respect to the ground, $R_t$ is a resistance value of the first detection resistor and the second detection resistor, $U_{PE}$ and $U'_{PE}$ are the first ground voltage and the second ground voltage respectively, $U_{bus}$ is a difference value between a positive bus voltage and a negative bus voltage of the photovoltaic inverter, and $U_{pv1}, U_{pv2}, \ldots, U_{pvn}$ are voltages of points to be measured of the respective photovoltaic module strings respectively.

2. The detection circuit according to claim 1, wherein a resistance value of the first detection resistor is equal to that of the second detection resistor.

3. The detection circuit according to claim 1, wherein a resistance value of the first detection resistor is different from that of the second detection resistor.

4. The detection circuit according to claim 1, wherein when the first switch is turned on and the second switch is turned off, a first ground voltage of the ground is measured currently to obtain a first equation; and when the first switch is turned off and the second switch is turned on, a second ground voltage of the ground is measured currently to obtain a second equation; wherein a total insulation impedance of at least one photovoltaic module string is calculated according to the first equation and the second equation, the total insulation impedance being defined as equivalent resistance of paralleling insulation impedances of the at least one photovoltaic module strings with respect to the ground, and the at least one photovoltaic module string are coupled with the photovoltaic inverter.

5. The detection circuit according to claim 1, wherein the negative bus voltage of the photovoltaic inverter is a reference voltage.

6. The detection circuit according to claim 1, wherein the detection circuit is coupled to an MPPT circuit of the photovoltaic inverter.

7. The detection circuit according to claim 1, wherein the detection circuit is coupled to an inverter bridge circuit of the photovoltaic inverter.

8. The detection circuit according to claim 6, wherein a topology of the MPPT circuit comprises a Boost circuit topology.

9. The detection circuit according to claim 7, wherein the inverter bridge circuit comprises a full bridge inverter circuit.

10. The detection circuit according to claim 1, wherein the first switch and the second switch comprise: two single-pole relays, one single-pole double-throw relay or two controllable semiconductor switches.

11. A photovoltaic inverter, comprising the detection circuit according to claim 1.

12. The photovoltaic inverter according to claim 11, wherein when the first switch is turned on and the second switch is turned off, a first ground voltage of the ground is measured currently to obtain a first equation; and when the first switch is turned off and the second switch is turned on, a second ground voltage of the ground is measured currently to obtain a second equation; a total insulation impedance of at least one photovoltaic module string coupled to the photovoltaic inverter with respect to the ground is calculated according to the first equation and the second equation, the total insulation impedance being defined as equivalent resistance of paralleling insulation impedances of the at least one photovoltaic module string with respect to the ground.

13. The photovoltaic inverter according to claim 11, wherein the negative bus voltage of the photovoltaic inverter is a reference voltage.

14. The photovoltaic inverter according to claim 11, wherein the detection circuit is coupled to an MPPT circuit of the photovoltaic inverter.

15. The photovoltaic inverter according to claim 11, wherein the detection circuit is coupled to an inverter bridge circuit of the photovoltaic inverter.

16. A detection method for detecting insulation resistance of a photovoltaic inverter, applied to the detection circuit for detecting insulation resistance of a photovoltaic inverter according to claim 1, comprising:

sampling and obtaining a positive bus voltage and a negative bus voltage of the photovoltaic inverter;

turning on the first switch and turning off the second switch, and measuring a first ground voltage of the ground to obtain a first equation;

turning off the first switch and turning on the second switch, and measuring a second ground voltage of the ground to obtain a second equation; and calculating a total insulation impedance of at least one photovoltaic module string coupled to the photovoltaic inverter with respect to the ground according to the first equation and the second equation, wherein the total insulation impedance is defined as equivalent resistance of paralleling insulation impedances of the at least photovoltaic module string with respect to the ground, wherein the equation set constituted by the first equation and the second equation is:

$$\begin{cases} \dfrac{U_{PV1} - U_{PE}}{R_{ISO1}} + \dfrac{U_{PV2} - U_{PE}}{R_{ISO2}} + \ldots + \dfrac{U_{PVn} - U_{PE}}{R_{ISOn}} + \dfrac{U_{bus} - U_{PE}}{R_p /\!/ R_t} = \dfrac{U_{PE}}{R_m} \\ \dfrac{U_{PV1} - U'_{PE}}{R_{ISO1}} + \dfrac{U_{PV2} - U'_{PE}}{R_{ISO2}} + \ldots + \dfrac{U_{PVn} - U'_{PE}}{R_{ISOn}} + \dfrac{U_{bus} - U'_{PE}}{R_p} = \dfrac{U'_{PE}}{R_m /\!/ R_t} \end{cases},$$

and the total insulation impedance is:

$$R_{ISO} = \dfrac{R_p R_m R_t (U'_{PE} - U_{PE})}{(R_p R_m + R_m R_t + R_p R_t)(U_{PE} - U'_{PE}) - R_m R_p U_{bus}},$$

wherein $R_{ISO}$ is a resistance value of the total insulation impedance, $R_{ISO1}$, $R_{ISO2}$, ..., $R_{ISOn}$ are insulation resistance values of the respective photovoltaic module strings with respect to the ground, $R_p$ and $R_m$ are resistance values of equivalent resistors of the positive bus and the negative bus with respect to the ground, $R_t$ is a resistance value of the first detection resistor and the second detection resistor, $U_{PE}$ and $U'_{PE}$ are the first ground voltage and the second ground voltage respectively, $U_{bus}$ is a difference value between a positive bus voltage and a negative bus voltage of the photovoltaic inverter, and $U_{pv1}$, $U_{pv2}$, ..., $U_{pvn}$ are voltages of points to be measured of the respective photovoltaic module strings respectively.

17. The detection method according to claim 16, wherein the negative bus voltage of the photovoltaic inverter is a reference voltage.

* * * * *